(12) United States Patent
Lee

(10) Patent No.: US 9,406,358 B1
(45) Date of Patent: Aug. 2, 2016

(54) DRIVING CIRCUIT AND DRIVING METHOD USING THE SAME

(71) Applicant: SK hynix Inc., Icheon-si Gyeonggi-do (KR)

(72) Inventor: Kyong Ha Lee, Yongin-si (KR)

(73) Assignee: SK Hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/812,895

(22) Filed: Jul. 29, 2015

(30) Foreign Application Priority Data

Jan. 30, 2015 (KR) .................. 10-2015-0014970

(51) Int. Cl.
*G11C 7/00* (2006.01)
*G11C 7/12* (2006.01)
*G11C 7/06* (2006.01)
*G11C 7/22* (2006.01)

(52) U.S. Cl.
CPC .. *G11C 7/12* (2013.01); *G11C 7/06* (2013.01); *G11C 7/22* (2013.01)

(58) Field of Classification Search
CPC ........... G11C 11/406; G11C 11/40615; G11C 2211/4061
USPC .......................................... 365/191, 222, 211
See application file for complete search history.

(56) References Cited

U.S. PATENT DOCUMENTS

2002/0191467 A1   12/2002   Matsumoto et al.
2010/0195412 A1*  8/2010    Furutani .................. G11C 8/06
                                                           365/189.05

FOREIGN PATENT DOCUMENTS

KR      20030009125 A       1/2003
KR      20030052359 A       6/2003

\* cited by examiner

*Primary Examiner* — Son Dinh
(74) *Attorney, Agent, or Firm* — William Park & Associates Ltd.

(57) ABSTRACT

A driving circuit includes a write operation controller configured to generate a write control signal according to a write command and a column address; a row controller configured to generate an auto refresh flag according to an auto refresh command and a row address; and a sense amplifier controller configured to enable the write control signal or the auto refresh flag according to a temperature flag, and generate an overdriving signal according to the enabled write control signal or the enabled auto refresh flag.

20 Claims, 6 Drawing Sheets

DRIVING CIRCUIT AND DRIVING METHOD USING THE SAME

CROSS-REFERENCES TO RELATED APPLICATION

The present application claims priority under 35 U.S.C. §119(a) to Korean application number 10-2015-0014970, filed on Jan. 30, 2015, in the Korean Intellectual Property Office, which is incorporated herein by reference in its entirety.

BACKGROUND

1. Technical Field

Various embodiments generally relate to a driving circuit and a driving method using the same, and more particularly, to a driving circuit and a driving method using the same, capable of performing different overdriving according to a temperature flag.

2. Related Art

In order to improve a data storage characteristic in the course of storing data in a memory, a scheme of overdriving a voltage to be provided to a sense amplifier coupled with the bit line pair of a memory cell is utilized.

In the case of performing an overdriving operation, data retention/write characteristics may be improved. However, if the overdriving operation is performed in all operation circumstances despite that a characteristic difference is not substantial when compared to the case of not performing overdriving, unnecessary power consumption may be caused. In particular, under a current situation in which the low power consumption characteristic of a memory is required, it is regarded as an important issue to reduce power consumption.

SUMMARY

In an embodiment, a driving circuit may include a write operation controller configured to generate a write control signal according to a write command and a column address. The driving circuit may also include a row controller configured to generate an auto refresh flag according to an auto refresh command and a row address. The driving circuit may also include a sense amplifier controller configured to enable the write control signal or the auto refresh flag according to a temperature flag, and generate an overdriving signal according to the enabled write control signal or the enabled auto refresh flag.

In an embodiment, a driving method may include generating a write control signal by according to a write command and a column address. The driving method may also include generating an auto refresh flag according to an auto refresh command and a row address. The driving method may also include selectively enabling the write control signal and the auto refresh flag according to a temperature flag. Further, the driving method may include generating an overdriving signal according to the enabled write control signal or the enabled auto refresh flag.

In an embodiment, a driving circuit may include a sense amplifier controller configured to enable a write control signal or an auto refresh flag according to a temperature flag, and generate an overdriving signal according to the enabled write control signal or the enabled auto refresh flag. The driving circuit may also include a bit line sense amplifier including an overdriving unit which provides a boosted voltage to a sense amplifier according to the overdriving signal. For example, the temperature flag is used to control driving signals provided to the bit line sense amplifier. The sense amplifier controller may generate the overdriving signal when the internal row address strobe time passes after a bank is enabled according to a bank active signal. The overdriving signal may be generated at a specified temperature condition so that the boosted voltage that is greater than a power supply voltage is provided to the bit line sense amplifier.

In an embodiment, the driving circuit may further include a temperature sensor sensing an internal and an external temperature and generating the temperature flag that indicates the low temperature or the high temperature. For example, the temperature sensor may provide the temperature flag to the sense amplifier controller.

DETAILED DESCRIPTION

Reference will now be made to the embodiments of the invention, and examples of the various embodiments are illustrated in the accompanying figures. Wherever possible, the same reference numbers will be used throughout the figures to refer to the same or like parts. In the driving circuit and the driving method using the same according to the embodiments, an overdriving operation is selectively performed in specified operations according to a temperature flag. Accordingly, since unnecessary overdriving operations may not be performed, power consumption may be minimized. The driving circuit and the driving method using the same according to the embodiments may be advantageously applied to a small electronic device including a memory since power consumption may be minimized as described above.

In association with the embodiments, specific structural and functional descriptions are disclosed only for illustrative purposes, the embodiments can be implemented in various ways without departing from the scope or spirit of the invention.

Various embodiments of the invention may be directed to a driving circuit and a driving method using the same, capable of performing an overdriving operation by sensing a specified temperature condition, thereby minimizing power consumption.

An embodiment of the invention may relate to a driving circuit and a driving method using the same, capable of effectively utilizing an operation characteristic poor under a specific temperature condition, thereby improving data retention/write characteristics and reducing power consumption.

Hereinafter, a driving circuit and a driving method using the same will be described below with reference to the accompanying figures through various embodiments.

Figure 1:
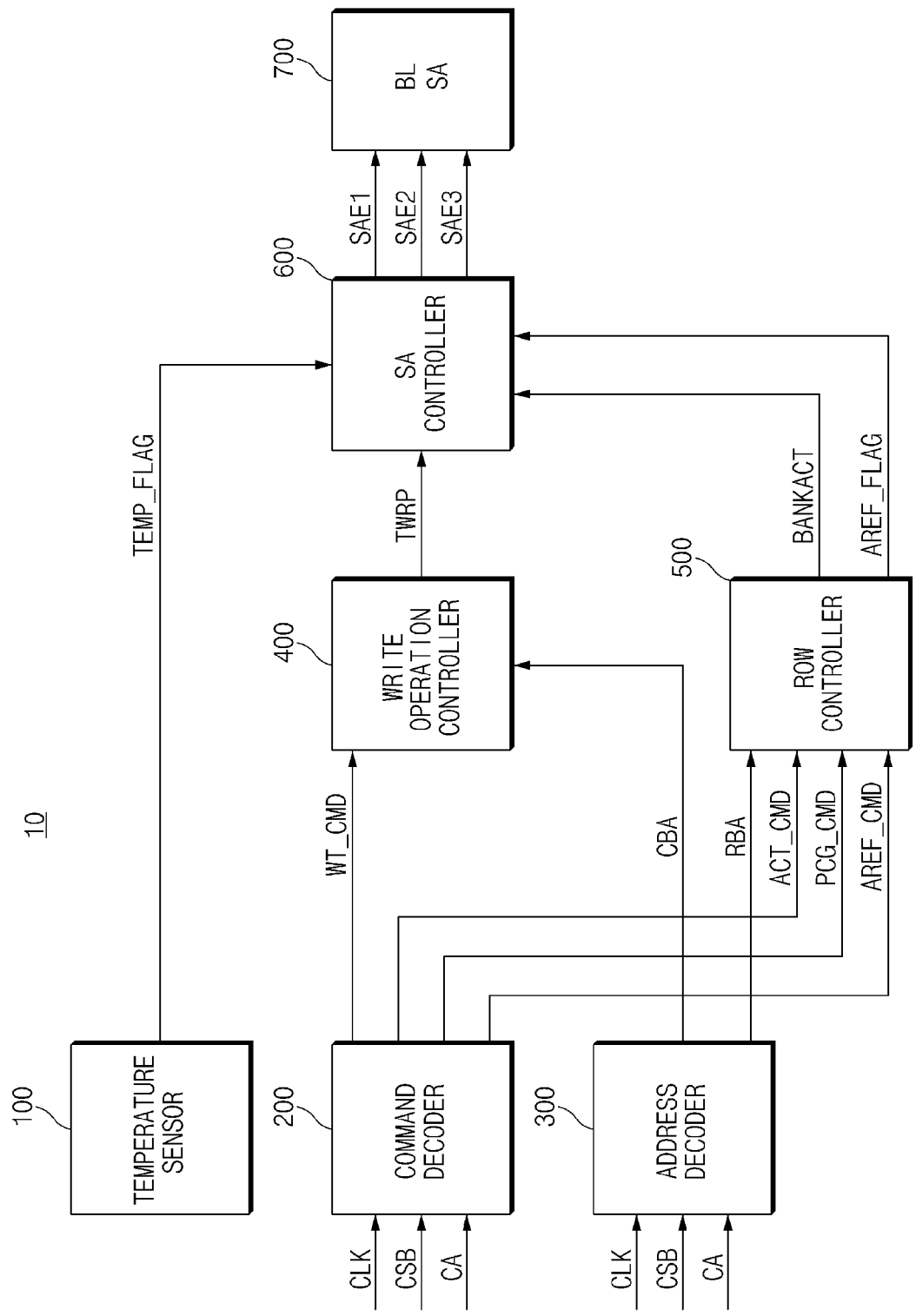
FIG. 1 is a block diagram illustrating a representation of an example of a driving circuit in accordance with an embodiment.

Referring to FIG. 1, a block diagram illustrating a representation of an example of a driving circuit in accordance with an embodiment is illustrated.

In FIG. 1, a driving circuit 10 in accordance with an embodiment may include a write operation controller 400, a row controller 500, and a sense amplifier controller 600.

In addition, according to an embodiment, the driving circuit 10 may further include at least one of a temperature sensor 100, a command decoder 200, an address decoder 300, and a bit line sense amplifier 700.

The driving circuit 10 may generate an overdriving signal SAE3 under a specified temperature condition. A boosted voltage VPP higher than a power supply voltage VDD may be provided to the bit line sense amplifier 700 in response to the overdriving signal SAE3. Further, the driving capability of the bit line sense amplifier 700 may be improved in response to the boosted voltage VPP.

The driving circuit 10 in accordance with an embodiment may control the generation of the overdriving signal SAE3 based on a temperature flag TEMP_FLAG from the temperature sensor 100 which senses specified temperature conditions. For example, the overdriving signal SAE3 may be generated only in a write operation where the temperature flag TEMP_FLAG indicates a low temperature, and may be generated only in an auto refresh operation where the temperature flag TEMP_FLAG indicates a high temperature.

Because a data write characteristic may deteriorate at a low temperature and a data refresh characteristic may deteriorate at a high temperature, the driving circuit 10 may generate the overdriving signal SAE3 based on a write command WT_CMD at a low temperature. Further, the driving circuit 10 may generate the overdriving signal SAE3 based on an auto refresh command AREF_CMD at a high temperature.

Components which configure the driving circuit 10 for operating as described above will be described below in detail.

The temperature sensor 100 senses a temperature inside and/or outside the driving circuit 10, and generates the temperature flag TEMP_FLAG which indicates a low temperature in the case where an ambient temperature is equal to or lower than a specified temperature and generates the temperature flag TEMP_FLAG which indicates a high temperature in the case where an ambient temperature is equal to or higher than a specified temperature.

The temperature flag TEMP_FLAG generated by the temperature sensor 100 may be generated by determining a low temperature or a high temperature through referring to preset temperatures according to a setting.

The temperature flag TEMP_FLAG is provided to the sense amplifier controller 600, and is used as a basis for controlling driving signals to be provided to the bit line sense amplifier 700.

The command decoder 200 may decode a clock signal CLK, a chip select signal CSB and a command address CA. The command decoder 200 may also generate a plurality of command signals. The plurality of command signals may include a write command WT_CMD, an active command ACT_CMD, a precharge command PCG_CMD, and an auto refresh command AREF_CMD.

The address decoder 300 may generate a column bank address CBA and a row bank address RBA based on the clock signal CLK, the chip select signal CSB and the command address CA similarly to the command decoder 200.

The write operation controller 400 may generate a write control signal TWRP by bank, based on the write command WT_CMD and the column bank address CBA. The write control signal TWRP is provided to the sense amplifier controller 600 such that the overdriving signal SAE3 is generated for only a position where a write operation is to be performed, at a low temperature in each bank.

The row controller 500 generates an auto refresh flag AREF_FLAG and a bank active signal BANKACT based on the auto refresh command AREF_CMD generated in the command decoder 200 and the row bank address RBA generated in the address decoder 300.

The sense amplifier controller 600 may selectively enable the write control signal TWRP and the auto refresh flag AREF_FLAG based on the temperature flag TEMP_FLAG. For example, the auto refresh flag AREF_FLAG may be enabled where the temperature flag TEMP_FLAG indicates a high temperature. Further, the write control signal TWRP may be enabled where the temperature flag TEMP_FLAG indicates a low temperature.

The sense amplifier controller 600 may generate the overdriving signal SAE3 based on the enabled write control signal TWRP or the enabled auto refresh flag AREF_FLAG.

According to an embodiment, where the write control signal TWRP is enabled and thus a write operation is to be performed for a specified bank based on the write command WT_CMD, the sense amplifier controller 600 may generate the overdriving signal SAE3 after a corresponding column is enabled, that is, after a column enable signal WT_YI is enabled and data information is provided through the column.

According to an embodiment, where the auto refresh flag AREF_FLAG is enabled, the sense amplifier controller 600 may generate the overdriving signal SAE3 after an internal row address strobe time tRAS passes based on the auto refresh command AREF_CMD. In detail, the sense amplifier controller 600 may generate the overdriving signal SAE3 when the internal row address strobe time tRAS passes after a bank is enabled in response to the bank active signal BANKACT.

Times at which the sense amplifier controller 600 generates the overdriving signal SAE3 will be described later with reference to FIGS. 3 and 4 below.

The sense amplifier controller 600 in accordance with an embodiment generates the overdriving signal SAE3 only where specified operations are performed at specified temperatures. Besides, the sense amplifier controller 600 may generate driving signals SAE1 and SAE2.

The first driving signal SAE1 generated by the sense amplifier controller 600 is a signal for providing the power supply voltage VDD to the bit line sense amplifier 700. In addition, the second driving signal SAE2 generated by the sense amplifier controller 600 is a signal for providing a core voltage VCORE to the bit line sense amplifier 700.

According to an embodiment, the power supply voltage VDD may be larger than the core voltage VCORE. In addition, the boosted voltage VPP may be larger than the power supply voltage VDD.

The bit line sense amplifier 700 may provide a specified voltage to a sense amplifier based on the driving signals SAE1 and SAE2 and the overdriving signal SAE3 provided from the sense amplifier controller 600. The bit line sense amplifier 700 may perform a sense amplification operation based on the provided voltage.

While the sense amplifier controller 600 generates and provides the sense amplification driving signals SAE1 and SAE2 in general operations, it generates the overdriving signal SAE3 in a high temperature auto refresh operation or a low temperature write operation such that the bit line sense amplifier 700 may perform an overdriving operation.

Figure 2:
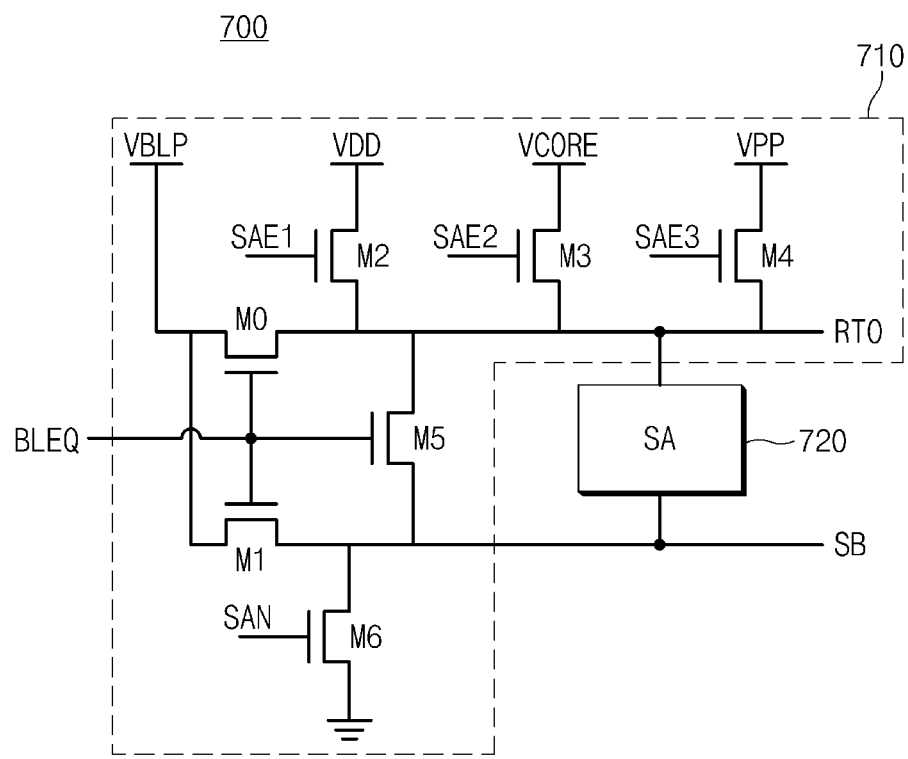
FIG. 2 is a diagram illustrating a representation of an example of the bit line sense amplifier shown in FIG. 1.

Referring to FIG. 2, a diagram illustrating a representation of an example of the bit line sense amplifier shown in FIG. 1 is illustrated.

The bit line sense amplifier 700 may include a sense amplifier driving circuit 710, and a sense amplifier 720 which is electrically coupled with a bit line pair.

In FIG. 2, the sense amplifier driving circuit 710 provides a specified voltage to an RTO line and an SB line which are electrically coupled with the sense amplifier 720.

The sense amplifier driving circuit 710 may include equalization means for retaining the voltage levels of the RTO line and the SB line to be the same, in response to a bit line equalization signal BLEQ. The equalization means may include first, second and sixth transistors M0, M1 and M5.

The sense amplifier driving circuit 710 may include a seventh transistor M6 which provides a ground voltage to the SB line in response to a third driving signal SAN.

The sense amplifier driving circuit 710 may include a first driving unit which provides the power supply voltage VDD to the RTO line in response to the first driving signal SAE1. The first driving unit may be realized by a third transistor M2.

The sense amplifier driving circuit 710 may include a second driving unit which provides the core voltage VCORE to the RTO line in response to the second driving signal SAE2. The second driving unit may be realized by a fourth transistor M3.

As described above, the power supply voltage VDD may be larger than the core voltage VCORE. In response to the active command ACT_CMD, the sense amplifier controller 600 generates the second driving signal SAE2 after generating the first driving signal SAE1.

The RTO line may retain a bit line precharge voltage VBLP before it is enabled according to the active command ACT_CMD to perform a specified operation. Further, in order to raise such a voltage, the RTO line may be initially driven by the power supply voltage VDD to shorten the voltage level rising time of the RTO line. Then, by stably providing the core voltage VCORE based on the second driving signal SAE2, the sense amplifier 720 may operate based on the core voltage VCORE in various operations.

The driving circuit 10 in accordance with an embodiment generates the overdriving signal SAE3 for a specified operation at a specified temperature condition such that an overdriving unit may provide the boosted voltage VPP larger than the power supply voltage VDD to the RTO line. To this end, the overdriving unit included in the sense amplifier driving circuit 710 may provide the boosted voltage VPP to the RTO line in response to the overdriving signal SAE3. In addition, the sense amplifier 720 may provide a higher voltage to the bit line pair according to data, based on the boosted voltage VPP. The overdriving unit may be realized by a fifth transistor M4.

Figure 3:
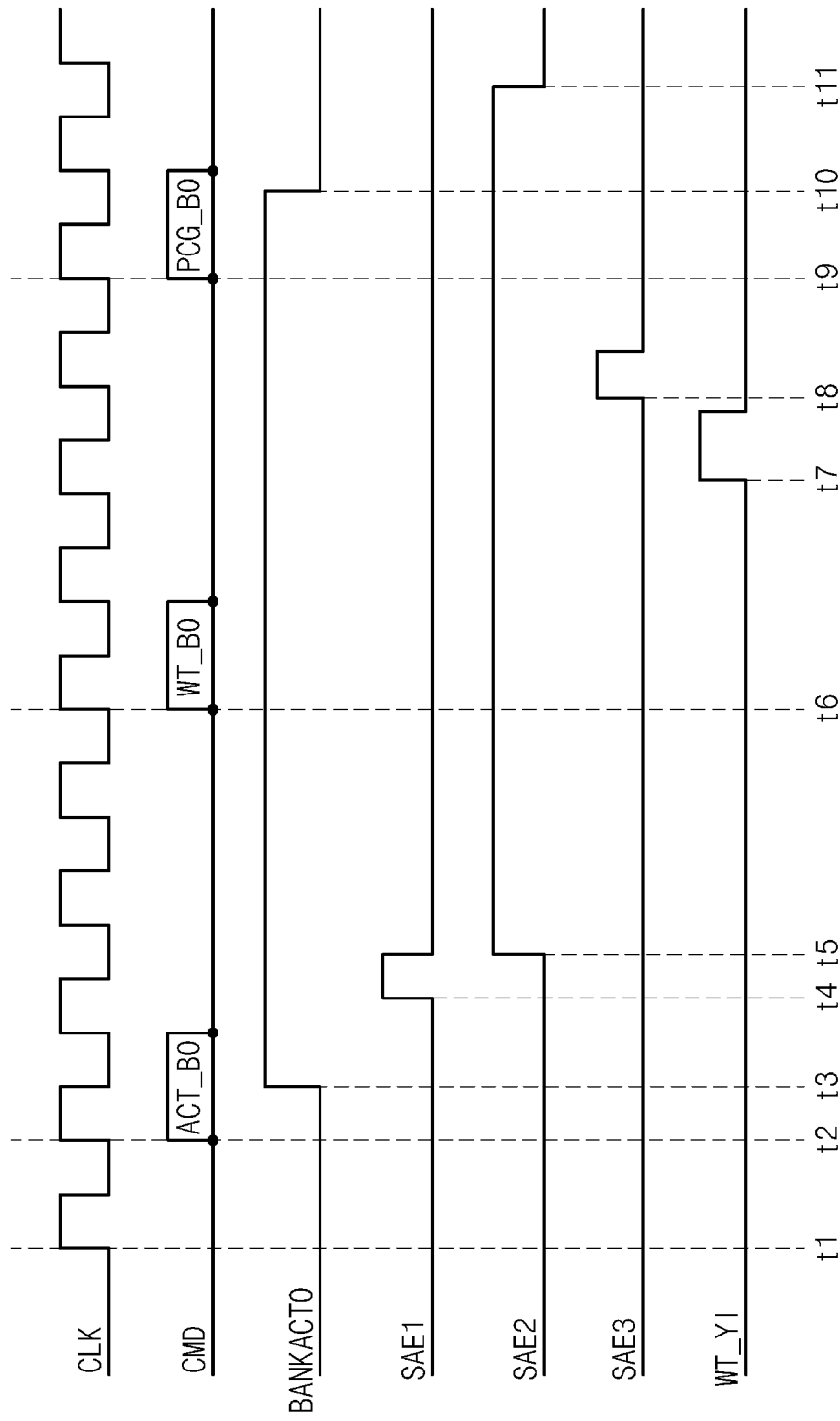
FIG. 3 is a representation of an example of a waveform diagram to assist in the explanation of the write operation of the driving circuit in accordance with an embodiment.

Referring to FIG. 3, a representation of an example of a waveform diagram to assist in the explanation of the write operation of the driving circuit in accordance with an embodiment is described.

In FIG. 3, the command decoder 200 may receive the clock signal CLK, the chip select signal CSB and the command address CA at a time t1. The command decoder 200 may generate the active command ACT_CMD at a time t2.

The row controller 500 receives the active command ACT_CMD for a first bank, that is, an active command ACT_B0, from the command decoder 200, receives the row bank address RBA from the address decoder 300, and generates the bank active signal BANKACT at a time t3. While it is illustrated in FIG. 3 that a first bank active signal BANKACT0 is generated, active signals for a plurality of banks may be enabled at different times.

The sense amplifier controller 600 enables the first driving signal SAE1 at a time t4 in response to the first bank active signal BANKACT0 received from the row controller 500. Thereafter the sense amplifier controller 600 enables the second driving signal SAE2 at a time t5.

As an active operation is performed in this way, it is possible to stand by a next operation in the state in which the core voltage VCORE is provided to the RTO line of the bit line sense amplifier 700.

As the command decoder 200 provides the write command WT_CMD for the first bank, that is, a write command WT_B0, at a time t6, data information may be loaded on the bit line pair electrically coupled to the first bank.

The write operation controller 400 generates the write control signal TWRP for the first bank. According to an embodiment, the write operation controller 400 may generate the write control signal TWRP by bank for the plurality of banks in addition to the first bank, based on the column bank address CBA.

The temperature sensor 100 may provide the temperature flag TEMP_FLAG which indicates a low temperature, to the sense amplifier controller 600.

In order for a write operation, the column may be enabled in response to the column enable signal WT_YI at a time t7. Further, the data loaded on the bit line pair electrically coupled to the first bank may be provided to the memory cells of the first bank, for example, the capacitors electrically coupled to the bit lines in the case of a DRAM.

The sense amplifier controller 600 enables the write control signal TWRP for the first bank based on the temperature flag TEMP_FLAG.

The bit line sense amplifier 700 generates the overdriving signal SAE3 in response to the enabled write control signal TWRP at a time t8. Where the temperature flag TEMP_FLAG does not indicate a low temperature in the sense amplifier controller 600, the write control signal TWRP is not enabled, and the overdriving signal SAE3 is not generated as well.

The sense amplifier driving circuit 710 provides the boosted voltage VPP to the RTO line in response to the overdriving signal SAE3. As such a boosted voltage VPP is provided to the sense amplifier 720 through the RTO line, the data loaded on the bit line pair may be reliably transferred to the memory cells of the first bank.

Thereafter, in response to the precharge command PCG_CMD for the first bank, that is, a precharge command PCG_B0, provided from the command decoder 200 at a time t9, the first bank active signal BANKACT0 is disabled at a time t10 and the second driving signal SAE2 is disabled at a time t11, by which the write operation is ended.

Figure 4:
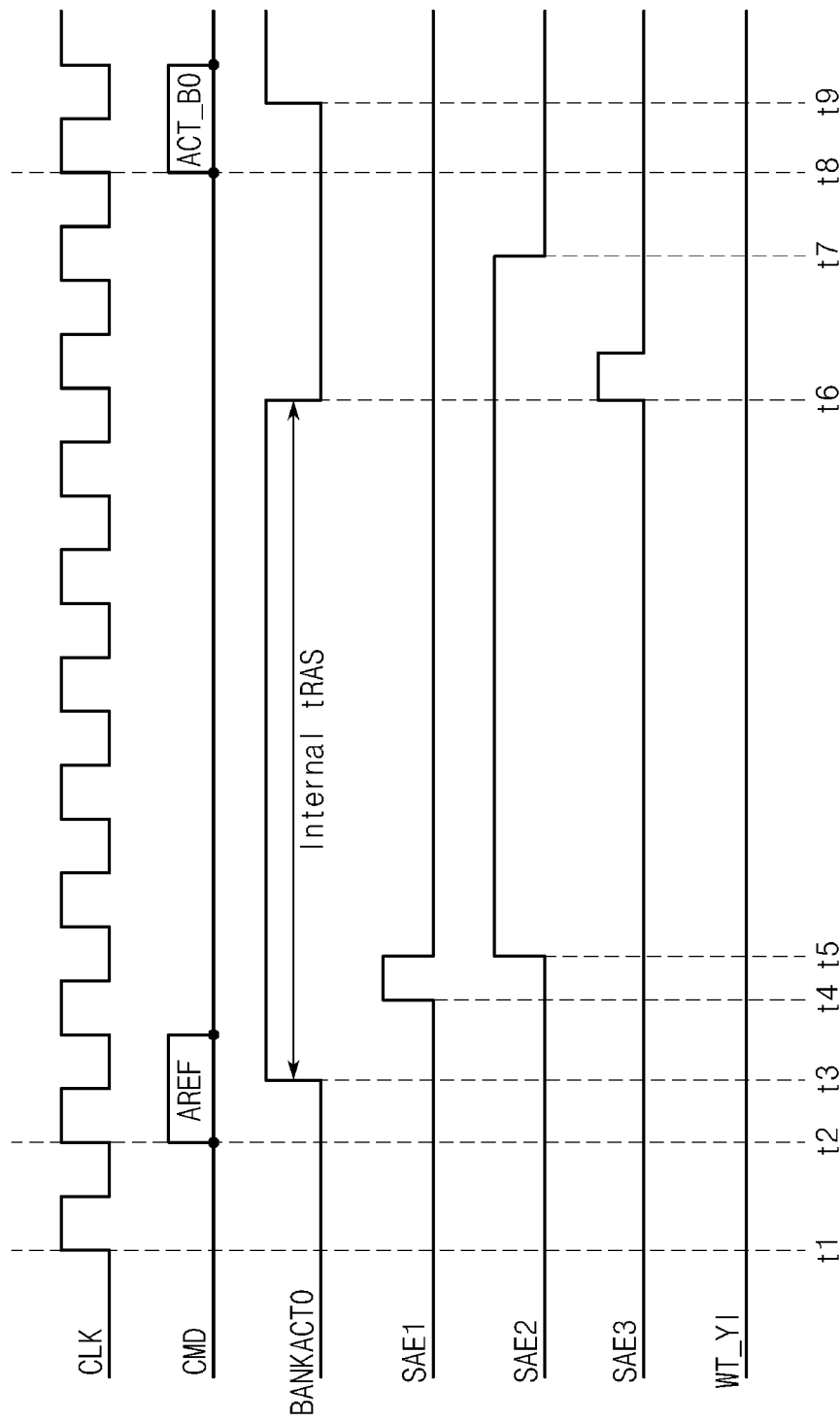
FIG. 4 is a representation of an example of a waveform diagram to assist in the explanation of the auto refresh operation of the driving circuit in accordance with an embodiment.

Referring to FIG. 4, a representation of an example of a waveform diagram to assist in the explanation of the auto refresh operation of the driving circuit in accordance with an embodiment is described.

In FIG. 4, the command decoder 200 receives the clock signal CLK, the chip select signal CSB and the command address CA at a time t1. The command decoder 200 also generates the auto refresh command AREF_CMD at a time t2.

The row controller 500 enables the first bank active signal BANKACT0 in response to the auto refresh command AREF_CMD at a time t3. The first bank active signal BANKACT0 may retain the enabled state for the internal row address strobe time Internal tRAS.

In addition, the row controller 500 may generate the auto refresh flag AREF_FLAG in response to the auto refresh command AREF_CMD.

The sense amplifier controller 600 generates the first driving signal SAE1 in response to the first bank active signal BANKACT0 at a time t4. The sense amplifier controller 600 also generates the second driving signal SAE2 at a time t5. Through this, the power supply voltage VDD and the core voltage VCORE may be sequentially provided to the RTO line by the first driving unit and the second driving unit of the sense amplifier driving circuit 710.

The sense amplifier controller 600 enables the auto refresh flag AREF_FLAG based on the temperature flag TEMP_FLAG. The sense amplifier controller 600 also generates the overdriving signal SAE3 at a time t6 when the internal row address strobe time Internal tRAS passes after the first bank active signal BANKACT0 is enabled, that is, from the time t3.

The boosted voltage VPP is provided to the RTO line in response to the overdriving signal SAE3. Through this, as the boosted voltage VPP higher than the core voltage VCORE is provided through the bit line pair electrically coupled with the sense amplifier 720, an auto refresh characteristic may be improved.

The second driving signal SAE2 is disabled at a time t7, by which the auto refresh operation is ended.

The command decoder 200 provides the first bank active signal ACT_B0 at a time t8, and in response to this, the row controller 500 generates the first bank active signal BANKACT0 at a time t9, by which a preparation for another operation is made.

Consequently, in the driving circuit 10 in accordance with an embodiment, when performing an operation according to the operation command decoded in the command decoder 200, the write control signal TWRP or the auto refresh flag AREF_FLAG for generating the overdriving signal SAE3 is selectively enabled based on the temperature flag TEMP_FLAG.

Therefore, the driving circuit 10 in accordance with an embodiment may generate the overdriving signal SAE3 for specified operations at specified temperatures. Accordingly, power to be consumed for performing overdriving may be minimized.

Figure 5:
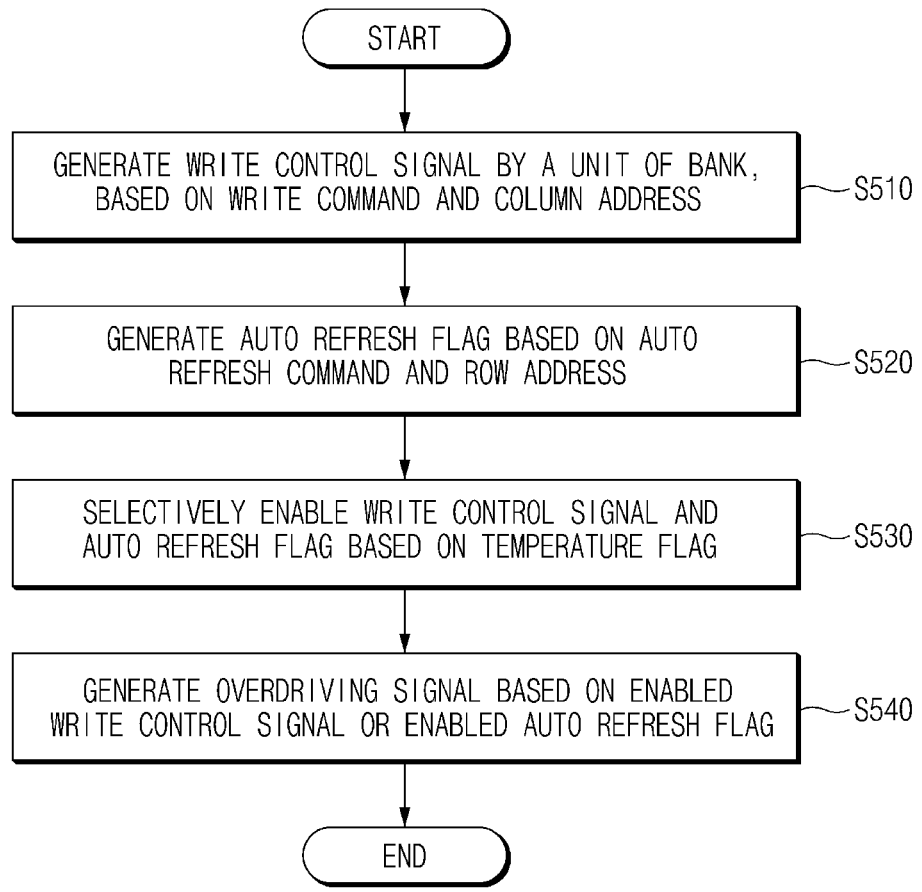
FIG. 5 is a representation of an example of a flow chart to assist in the explanation of a driving method in accordance with an embodiment.

Referring to FIG. 5, a representation of an example of a flow chart to assist in the explanation of a driving method in accordance with an embodiment is described.

The driving method to be described below with reference to FIG. 5 may be performed using the driving circuit 10 of FIG. 1. In FIG. 5, the write operation controller 400 generates the write control signal TWRP based on the write command WT_CMD provided from the command decoder 200 and the column bank address CBA provided from the address decoder 300. The write control signal TWRP may be generated by bank (step S510).

Unlike this, the auto refresh command AREF_CMD may be decoded by the command decoder 200 and may be provided to the row controller 500. The row controller 500 may also receive the row bank address RBA from the address decoder 300. The row controller 500 may generate the auto refresh flag AREF_FLAG (step S520). Moreover, the row controller 500 may generate the bank active signal BANKACT based on the row bank address RBA.

The steps S510 and S520 for performing different operations may not be performed simultaneously. Further, there is no priority between the step S510 and the step S520.

The sense amplifier controller 600 selectively enables the write control signal TWRP received from the write operation controller 400 and the auto refresh flag AREF_FLAG received from the row controller 500, based on the temperature flag TEMP_FLAG (step S530).

For example, the sense amplifier controller 600 may enable the write control signal TWRP where the temperature flag TEMP_FLAG indicates a low temperature. The sense amplifier controller 600 may enable the auto refresh flag AREF_FLAG where the temperature flag TEMP_FLAG indicates a high temperature.

The sense amplifier controller 600 generates the overdriving signal SAE3 based on the enabled write control signal TWRP or the enabled auto refresh flag AREF_FLAG (step S540).

According to an embodiment, where the sense amplifier controller 600 enables the write control signal TWRP, the write control signal TWRP is generated by bank based on the write command WT_CMD and the column bank address CBA. Thus, after a column included in a bank for which a write operation is to be performed is enabled, the overdriving signal SAE3 may be generated.

Unlike this, where the auto refresh flag AREF_FLAG is enabled, the sense amplifier controller 600 may generate the overdriving signal SAE3 when the internal row address strobe time Internal tRAS passes after the bank active signal BANKACT is enabled.

Where the overdriving signal SAE3 is provided, the bit line sense amplifier 700 may provide the boosted voltage VPP to the RTO line in response to the overdriving signal SAE3, thereby providing the boosted voltage VPP to the sense amplifier 720.

Where the overdriving signal SAE3 is not provided, the bit line sense amplifier 700 may sequentially provide the power supply voltage VDD and the core voltage VCORE lower than the boosted voltage VPP to the sense amplifier 720 according to the operation characteristic thereof.

Figure 6:
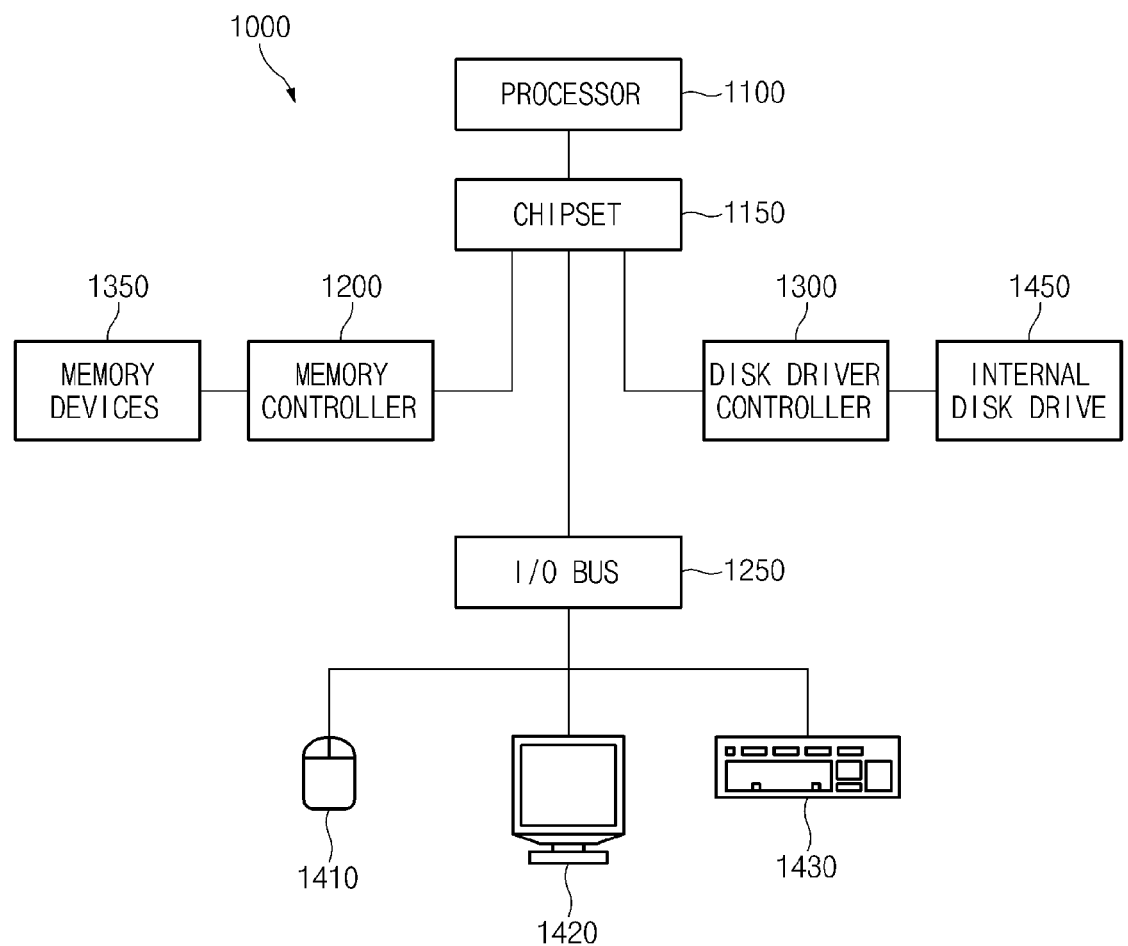
FIG. 6 illustrates a block diagram of a system employing a memory controller circuit in accordance with an embodiment of the invention.

Referring to FIG. 6, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory devices 1350 may include the driving circuit mentioned above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

As is apparent from the above descriptions, in the driving circuit and the driving method using the same in accordance with the embodiments, the overdriving signal SAE3 is generated by selectively enabling an operation signal based on the temperature flag TEMP_FLAG. Therefore, because an overdriving operation is selectively performed, power consumption may be minimized while improving data write/storage characteristics according to temperatures.

While various embodiments have been described above, it will be understood to those skilled in the art that the embodiments described are by way of examples only. Accordingly, the driving circuit and the driving method using the same described herein should not be limited based on the described embodiments above.

What is claimed is:

1. A driving circuit comprising:
   a write operation controller configured to generate a write control signal according to a write command and a column address;
   a row controller configured to generate an auto refresh flag according to an auto refresh command and a row address; and
   a sense amplifier controller configured to enable the write control signal or the auto refresh flag according to a temperature flag, and generate an overdriving signal according to the enabled write control signal or the enabled auto refresh flag.

2. The driving circuit according to claim 1, wherein, where the write control signal is enabled, the sense amplifier controller generates the overdriving signal after a column included in a bank is enabled based on the write command.

3. The driving circuit according to claim 2, wherein where the auto refresh flag is enabled, the sense amplifier controller generates the overdriving signal after an internal row address strobe time passes based on the auto refresh command.

4. The driving circuit according to claim 1, wherein the sense amplifier controller enables the write control signal where the temperature flag indicates a low temperature, and enables the auto refresh flag where the temperature flag indicates a high temperature.

5. The driving circuit according to claim 1, further comprising:
   a bit line sense amplifier including an overdriving unit which provides a boosted voltage to a sense amplifier based on the overdriving signal.

6. The driving circuit according to claim 5, wherein the bit line sense amplifier comprises:
   a first driving unit configured to provide a first voltage to the sense amplifier in response to a first driving signal; and
   a second driving unit configured to provide a second voltage lower than the first voltage to a bit line pair in response to a second driving signal.

7. The driving circuit according to claim 6, wherein the sense amplifier controller generates the second driving signal after generating the first driving signal.

8. A driving method comprising:
   generating a write control signal by according to a write command and a column address;
   generating an auto refresh flag according to an auto refresh command and a row address;
   selectively enabling the write control signal and the auto refresh flag according to a temperature flag; and
   generating an overdriving signal according to the enabled write control signal or the enabled auto refresh flag.

9. The driving method according to claim 8, wherein the selectively enabling comprises:
   enabling the write control signal where the temperature flag indicates a low temperature and enabling the auto refresh flag where the temperature flag indicates a high temperature.

10. The driving method according to claim 9, wherein the generating of the overdriving signal comprises:
    generating the overdriving signal after a column included in abank is enabled based on the write command where the write control signal is enabled.

11. The driving method according to claim 9, wherein the generating of the overdriving signal comprises:
    generating the overdriving signal when an internal row address strobe time passes after a bank is enabled based on the auto refresh command where the auto refresh flag is enabled.

12. The driving method according to claim 8, further comprising:
    providing a boosted voltage to a sense amplifier based on the overdriving signal.

13. The driving method according to claim 12, further comprising:
    sequentially providing first and second voltages lower than the boosted voltage to the sense amplifier in response to the auto refresh command or the write command.

14. A driving circuit comprising:
    a sense amplifier controller configured to enable a write control signal or an auto refresh flag according to a temperature flag, and generate an overdriving signal according to the enabled write control signal or the enabled auto refresh flag; and
    a bit line sense amplifier including an overdriving unit which provides a boosted voltage to a sense amplifier according to the overdriving signal.

15. The driving circuit according to claim 14, wherein, in the case where the write control signal is enabled, the sense amplifier controller generates the overdriving signal after a column included in a bank is enabled based on a write command.

16. The driving circuit according to claim 15, wherein, in the case where the auto refresh flag is enabled, the sense amplifier controller generates the overdriving signal after an internal row address strobe time passes based on an auto refresh command.

17. The driving circuit according to claim 14, wherein the sense amplifier controller enables the write control signal where the temperature flag indicates a low temperature, and enables the auto refresh flag where the temperature flag indicates a high temperature.

18. The driving circuit according to claim 14, wherein the bit line sense amplifier comprises:
    a first driving unit configured to provide a first voltage to the sense amplifier in response to a first driving signal; and
    a second driving unit configured to provide a second voltage lower than the first voltage to a bit line pair in response to a second driving signal.

19. The driving circuit according to claim 17, wherein the overdriving signal is generated only in a write operation when the temperature flag indicates the low temperature.

20. The driving circuit according to claim 17, wherein the overdriving signal is generated only in an auto refresh operation when the temperature flag indicates the high temperature.

* * * * *